United States Patent
Tsutsumi et al.

(10) Patent No.: US 8,367,941 B2
(45) Date of Patent: Feb. 5, 2013

(54) FILTER, BRANCHING FILTER, COMMUNICATION MODULE, AND COMMUNICATION EQUIPMENT

(75) Inventors: Jun Tsutsumi, Tokyo (JP); Kazuhiro Matsumoto, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 103 days.

(21) Appl. No.: 12/918,781

(22) PCT Filed: Feb. 20, 2008

(86) PCT No.: PCT/JP2008/052827
§ 371 (c)(1),
(2), (4) Date: Aug. 20, 2010

(87) PCT Pub. No.: WO2009/104251
PCT Pub. Date: Aug. 27, 2009

(65) Prior Publication Data
US 2010/0319975 A1     Dec. 23, 2010

(51) Int. Cl.
*H05K 1/16* (2006.01)
(52) U.S. Cl. ........ 174/260; 174/250; 333/202; 361/777; 361/778; 361/795
(58) Field of Classification Search ............... 361/748, 361/777, 778, 795; 333/202, 204; 174/250–262
See application file for complete search history.

(56) References Cited

U.S. PATENT DOCUMENTS

| | | | | |
|---|---|---|---|---|
| 5,859,473 A | * | 1/1999 | Ikata et al. | 257/723 |
| 6,483,714 B1 | * | 11/2002 | Kabumoto et al. | 361/760 |
| 6,743,975 B2 | * | 6/2004 | Kolb | 174/350 |
| 6,914,500 B2 | * | 7/2005 | Hirabayashi | 333/204 |
| 7,613,009 B2 | * | 11/2009 | Young et al. | 361/782 |
| 2005/0133257 A1 | | 6/2005 | Lauffer et al. | |

(Continued)

FOREIGN PATENT DOCUMENTS

| | | |
|---|---|---|
| JP | 2004-166258 A | 6/2004 |
| JP | 2005-151287 A | 6/2005 |

(Continued)

OTHER PUBLICATIONS

International Search Report (ISR) issued in PCT/JP2008/052827 (parent application) mailed in Jun. 2008 for Examiner consideration.

(Continued)

*Primary Examiner* — Angel R Estrada
*Assistant Examiner* — Dimary Lopez
(74) *Attorney, Agent, or Firm* — Chen Yoshimura LLP (57) ABSTRACT

A filter of the present invention is a filter including a substrate and a filter element mounted on the substrate, wherein the substrate is provided with a plurality of wiring layers including a filter element wiring layer which is formed with wirings and connected with the filter element, an insulating layer interposed between the plural wiring layers and a ground pattern formed in at least a part of a wiring layer under the filter element wiring layer; and the thickness of the insulating layer interposed between the filter element wiring layer and the other wiring layer is smaller than the width of the wiring formed in the filter element wiring layer, and is larger than the thickness of the other wiring layer. By such a configuration, a thin, high-suppression and high-isolation filter can be realized.

15 Claims, 12 Drawing Sheets

U.S. PATENT DOCUMENTS

| | | |
|---|---|---|
| 2005/0200429 A1 | 9/2005 | Adachi et al. |
| 2006/0044080 A1 | 3/2006 | Hagiwara et al. |
| 2006/0076668 A1* | 4/2006 | Kim .............................. 257/691 |
| 2006/0132260 A1 | 6/2006 | Iwamoto et al. |
| 2008/0070519 A1* | 3/2008 | Okabe ........................ 455/127.1 |

FOREIGN PATENT DOCUMENTS

| | | |
|---|---|---|
| JP | 2005-183949 A | 7/2005 |
| JP | 2005-277522 A | 10/2005 |
| JP | 2006-180192 A | 7/2006 |

OTHER PUBLICATIONS

Written Opinion (PCT/ISA/237) issued in PCT/JP2008/052827 (parent application) mailed in Jun. 2008.

* cited by examiner

FIG. 13

FILTER, BRANCHING FILTER, COMMUNICATION MODULE, AND COMMUNICATION EQUIPMENT

TECHNICAL FIELD

The present invention relates to a filter such as a high-frequency filter used for mobile communication equipment or radio equipment represented by a mobile phone. Also, the present invention relates to a duplexer using such a filter. Also, the present invention relates to a communication module and a communication device in which such a filter or duplexer is built-in.

BACKGROUND ART

In recent years, a multiband/multisystem advances for radio communication equipment represented by a mobile phone terminal has been made, and a plurality of communication devices are mounted in one terminal. However, the mobile phone terminal itself is continuously required to achieve a reduction in size and thickness, and reduction in size and thickness of a communication device mounted therein is eagerly demanded. Under such a background, a reduction in size and thickness of a component used for the communication device becomes essential, and a reduction in size and thickness of principal parts such as high-frequency filters or duplexers are eagerly desired.

Figure 12:
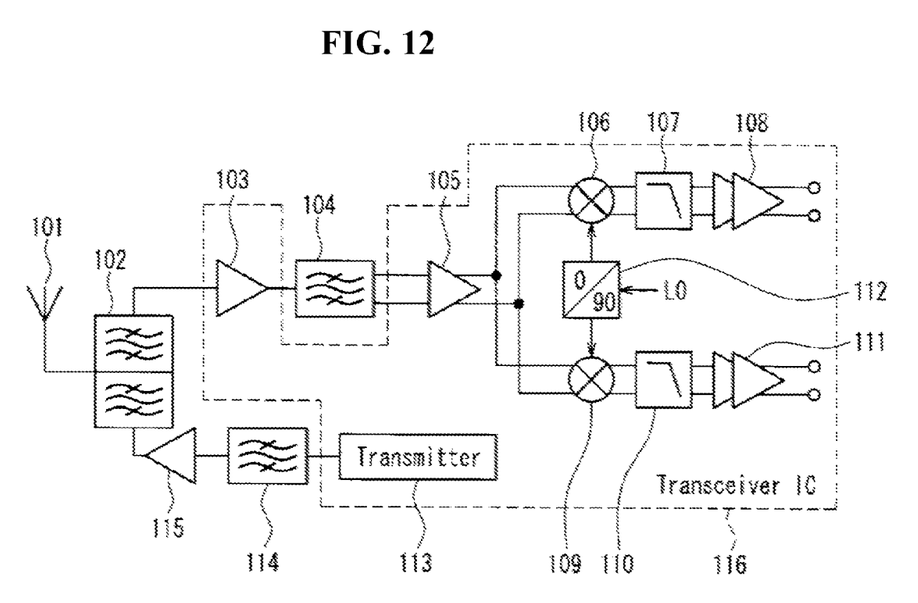
FIG. 12 is a block diagram showing a configuration of a conventional high-frequency block.
Figure 13:
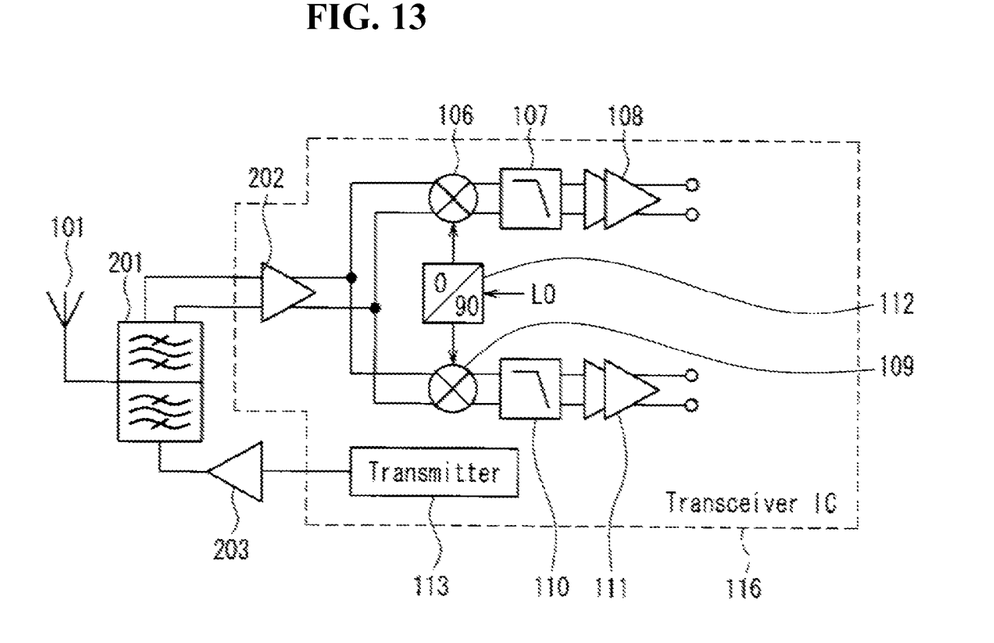
FIG. 13 is a block diagram showing a configuration of a high-frequency block in the future.

As another method for achieving a reduction in size of the communication device, there is a tendency to simplify the communication device and decrease the number of components used therein. For example, FIG. 12 shows a configuration of a high-frequency block in a conventional mobile phone terminal. In the high-frequency block shown in FIG. 12, a reception path is connected with an inter-stage reception filter 104, and a transmission path is connected with an inter-stage transmission filter 114. On the other hand, a high-frequency block shown in FIG. 13 is configured such that the inter-stage transmission filter and the inter-stage reception filter are omitted for the purpose of simplifying the communication device. The high-frequency block shown in FIG. 12 is provided with an antenna 101, a duplexer 102, a low noise amplifier (LNA) 103, an inter-stage reception filter 104, an LNA 105, mixers 106 and 109, low-pass filters (LPFs) 107 and 110, variable gain amplifiers (VGAs) 108 and 111, a phase control circuit 112, a transmitter 113, an inter-stage transmission filter 114 and a power amplifier (PA) 115. On the other hand, on the high-frequency block shown in FIG. 13, in the reception side, the inter-stage reception filter 104 is omitted, and an LNA 202 is provided to replace the LNAs 103 and 105. Also, on the transmission side, the inter-stage transmission filter 114 is omitted.

In this manner, in the high-frequency block shown in FIG. 13, since the number of the filter elements is reduced, the remaining filter element (duplexer 201) is required to have performances of the two conventional filter elements (inter-stage reception filter 104 and inter-stage transmission filter 114). Specifically, a great enhancement of out-of-band suppression, of the filter characteristic is required. Also, in addition to the above, a great enhancement of isolation between transmission and reception is demanded in the duplexer 201.

In this manner, in the high-frequency filter and duplexer used for a mobile phone terminal and the like, there was a problem that great enhancements in characteristics such as suppression level outside the pass-band and the isolation is required while continuously reducing the size and thickness.

One of the factors that hinder the high suppression and high isolation of the filter and duplexer is unnecessary electromagnetic coupling generated in a substrate on which a filter element is mounted. To solve this problem, for example, in a configuration disclosed in Patent Document 1, a mounted package on which a filter element is mounted disposes a ground pattern (partitioning ground pattern) for partitioning a plurality of wirings present in one wiring layer between the wirings, thereby suppressing unnecessary electromagnetic coupling between the wirings to improve the suppression level of the filter.

Here, for the purpose of suppressing the unnecessary electromagnetic coupling between the wirings, in the case of disposing a ground pattern on the same wiring layer as those wirings, it would be better to make the ground pattern as close as possible to the wirings. This is because electromagnetic fields radiated from the respective wirings will be induced into the partitioning ground pattern for certain, whereby the electromagnetic coupling between the respective wirings will be reduced.

Patent Document 1: JP-A-2006-180192 (Published Application)

DISCLOSURE OF THE INVENTION

Problems that the Invention is to Solve

However, since the gap between the wiring and the partitioning ground pattern has to be as wide as the line width (line/space=1/1); there was a limit in suppressing such unnecessary electromagnetic coupling; and therefore a signal of the filter outside a pass-band could not be greatly suppressed; and the isolation between transmission and reception could not be greatly enhanced.

An object of the present invention is to provide a filter, a duplexer, a communication module and a communication device capable of suppressing unnecessary electromagnetic coupling in a substrate on which a filter element is mounted, having high suppression and high isolation characteristics while realizing a reduction in size and thickness.

Means for Solving the Problems

A first filter of the present invention is a filter comprising a substrate and a filter element mounted on the substrate, wherein the substrate is provided with a plurality of wiring layers including a filter element wiring layer with a wiring formed thereon, and the filter element being connected to said filter element wiring layer, an insulating layer interposed between the plurality of wiring layers, and a ground pattern formed in at least a part of a wiring layer under the filter element wiring layer; and the thickness of the insulating layer interposed between the filter element wiring layer and the other wiring layer is smaller than the width of the wiring formed in the filter element wiring layer, and is larger than the thickness of the other wiring layer.

A second filter of the present invention is a filter comprising a substrate and a filter element mounted on the substrate, wherein the substrate is provided with a plurality of wiring layers including a filter element wiring layer with a wiring formed thereon, and the filter element being connected to said filter element wiring layer, an insulating layer interposed between the plural wiring layers and a ground part formed in at least a part of another wiring layer under the filter element wiring layer; and the thickness of the insulating layer interposed between the filter element wiring layer and the other wiring layer is smaller than the distance between the most adjacent wirings in the filter element wiring layer, and is larger than the thickness of the other wiring layer.

Advantages of the Invention

According to the present invention, it is possible to provide a filter and a duplexer having high suppression and high isolation. Also, since an outermost surface insulating layer of the substrate is reduced in thickness, the resulting filter and duplexer can be made smaller and thinner. Also, when mounted with such a filter or duplexer, it is possible to realize a reduction in size and thickness of a communication module or a communication device.

BEST MODES FOR CARRYING OUT THE INVENTION

A first filter of the present invention is a filter comprising a substrate and a filter element mounted on the substrate, wherein the substrate is provided with a plurality of wiring layers including a filter element wiring layer with a wiring formed thereon, and the filter element being connected to said filter element wiring layer, an insulating layer interposed between the plurality of wiring layers and a ground part formed in at least apart of another wiring layer under the filter element wiring layer; and the thickness of the insulating layer interposed between the filter element wiring layer and the other wiring layer is smaller than the width of the wiring formed in the filter element wiring layer, and is larger than the thickness of the other wiring layer. According to such a configuration, not only the unnecessary electromagnetic coupling can be suppressed, but the isolation between reception and transmission can be greatly improved.

In the filter of the present invention, the thickness of the insulating layer formed at a position interposed between the filter element wiring layer and the other wiring layer is not more than 75% of the width of the wiring formed in the filter element wiring layer and is larger than the thickness of the other wiring layer. Such configuration is more desirable over the prior art in that a partitioning ground as in the prior art is not necessary, thereby enhancing the design freedom of the wiring pattern.

A second filter of the present invention is a filter comprising a substrate and a filter element mounted on the substrate, wherein the substrate is provided with a plurality of wiring layers including a filter element wiring layer with a wiring formed thereon, and the filter element being connected to said filter element wiring layer, an insulating layer interposed between the plural wiring layers, and a ground part formed in at least a part of another wiring layer under the filter element wiring layers; and the thickness of the insulating layer interposed between the filter element wiring layer and the other wiring layer is smaller than the distance between the most adjacent wirings in the filter element wiring layer, and is larger than the thickness of the other wiring layer. By such a configuration, in the case where a partitioning ground pattern cannot be disposed between the neighboring wirings, by making the thickness of the outermost surface insulating layer thinner than the distance between the wirings and the neighboring ground pattern of the other wiring layer, thereby exposing the electromagnetic field radiations from the respective wirings toward the ground pattern, unnecessary electromagnetic coupling between wirings can be suppressed. In this respect, the outermost surface insulating layer as referred to herein is an insulating layer on which the filter is mounted.

In the filter of the present invention, the ground part can be configured to be disposed in at least a part of a region directly under two wirings including the most adjacent part among the wirings formed in the filter element wiring layer. With such a configuration, electromagnetic fields radiated from the wirings of the filter element wiring layer can be induced into the ground pattern directly thereunder, and radiation of the electromagnetic fields into surroundings can be suppressed.

In the filter of the present invention, the ground part can be configured to be disposed in at least a part of a region directly under the filter element in the other wiring layer. With such a configuration, the unnecessary electromagnetic coupling can be suppressed.

In the filter of the present invention, the ground part can be configured to be disposed in at least a part of a region directly under a wiring connected to a ground terminal of the filter element among the wirings formed in the filter element wiring layer in the other wiring layer. With such a configuration, the unnecessary electromagnetic coupling can be suppressed.

In the filter of the present invention, the substrate can be configured to be formed of a ceramic material. With such a configuration, it becomes easy to seal the filter element 5 in an airtight manner. Furthermore, in general, the ceramic material is small in dielectric loss tangent, and a loss of each of a high-frequency filter and a duplexer can be kept small. In consequence, it is possible to realize a high-frequency filter and a duplexer with high suppression with a low loss.

In the filter of the present invention, the substrate can be configured to be formed of a resin material. With such a configuration, in the case of mounting a plurality of filter elements on the substrate, even when the size of the substrate is large, it is possible to reduce the cost of the filter by using a resin printed wiring board.

In the filter of the present invention, at least an outermost surface insulating layer in the substrate can be configured to be formed of a resin material and that at least apart of the other insulating layer in the substrate is formed of a ceramic material. In this way, by forming the outermost surface insulating layer using a resin which is in general easier for achieving a reduction in thickness than a ceramic, it is possible to easily prepare a thin outermost surface insulating layer. Also, by preparing the insulating layer other than the outermost surface insulating layer by using a ceramic having a characteristic that the dielectric loss tangent is small as compared with that of a resin, it is possible to prepare an insulating layer with small dielectric loss tangent. In consequence, advantages of the both materials can be effectively applied.

In the filter of the present invention, the filter element is configured of an acoustic wave filter. With such a configuration, it is possible to realize a small-sized high-frequency filter and a duplexer in a low loss.

In the filter of the present invention, the filter element can be configured to be mounted on the substrate by face down bonding.

In the filter of the present invention, the ground part can be configured to be connected with a foot pattern for earth of the substrate by a plurality of vias between layers. With such a configuration, since a potential of the ground pattern disposed in the other wiring layer becomes close to that of a true ground, an electromagnetic field radiated from the wiring of the filter element wiring layer advances more toward the ground pattern, and the unnecessary electromagnetic coupling between wirings can be suppressed.

Embodiment

1. Configurations of Filter and Duplexer

The feature of the present invention is that the ground pattern is disposed more closely to the wiring pattern which generates the unnecessary electromagnetic coupling as compared with the prior art.

Figure 1A:
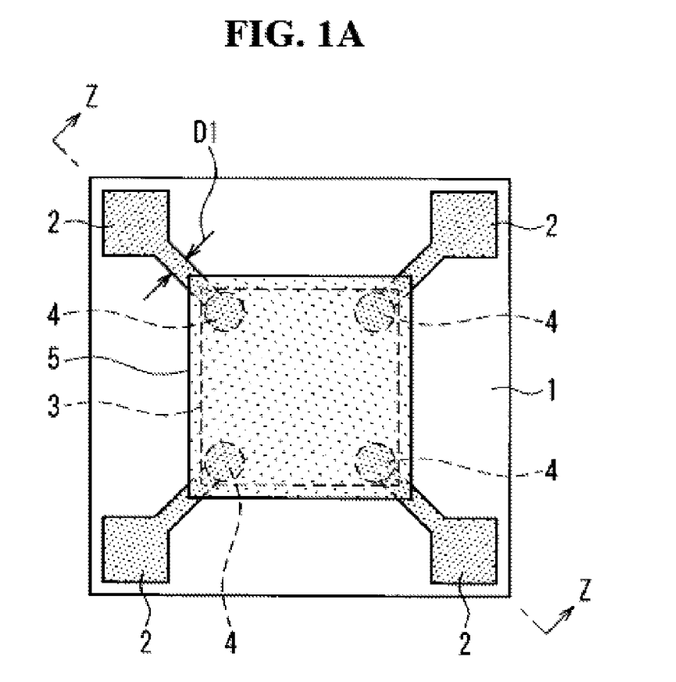
FIG. 1A is a plain view of a filter according to an embodiment.
Figure 1B:
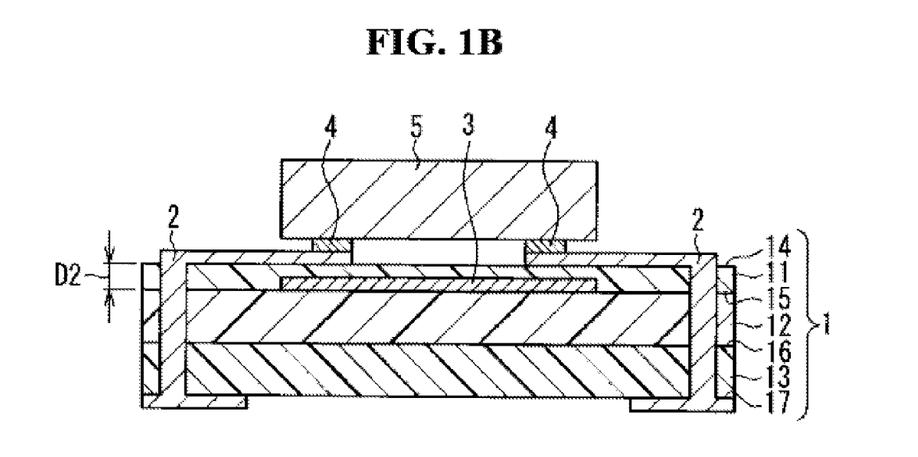
FIG. 1B is a cross-sectional view of Z-Z in FIG. 1A.

FIG. 1A is a plain view showing a configuration of a filter according to an embodiment. FIG. 1B is a cross-sectional view of a Z-Z part in FIG. 1A. The filter according to the present embodiment is provided with a substrate 1, a wiring 2, a ground pattern 3, a bonding pad part 4 and a filter element 5. In this respect, the ground pattern 3 is an example of the ground part of the present invention.

The substrate 1 is provided with a first insulating layer 11, a second insulating layer 12, and a third insulating layer 13. A first wiring layer 14 is formed on the filter mounting surface in the first insulating layer 11. In this respect, the first wiring layer 14 according to the present embodiment is one example of the filter element wiring layer of the present invention. A second wiring layer 15 is formed on the surface of the side of the first insulating layer 11 in the second insulating layer 12. Also, the ground pattern 3 is arranged in at least apart of the second wiring layer 15. A third wiring layer 16 is formed on the surface of the side of the second insulating layer 12 in the third insulating layer 13. Also, a fourth wiring layer 17 is formed on back side of the surface on which the third wiring layer 16 in the third insulating layer 13 is formed.

The wiring 2 is arranged in via formed penetrating from the first wiring layer 14 to the fourth wiring layer 17 of the substrate 1 and electrically conducts the back and front of the substrate 1. The bonding pad part 4 is electrically connected to one end of the wiring 2 (the end of the side of the first wiring layer 14). The filter element 5 is electrically connected to the bonding pad part 4.

wiring The filter shown in FIGS. 1A and 1B is configured such that the ground pattern 3 is disposed directly under the wiring of the first wiring layer 14 and such that a thickness D2 of the first insulating layer 11 (outermost surface insulating layer), which is interposed between the first wiring layer 14 and the second wiring layer 15 positioning thereunder, is thinner than a line width D1 of the wiring 2 for the purpose of suppressing the unnecessary electromagnetic coupling among wirings in the first wiring layer 14 disposed on the filter mounting surface.

With such a configuration, compared with a configuration where a partitioning ground pattern is disposed within the same wiring layer as in the conventional configuration, a distance between the wiring in the first wiring layer 14 and the ground pattern 3 can be shortened. This is because the ground pattern cannot be closer than the line width within the same wiring layer. That is, in the present embodiment, unlike arranging a wiring and a ground pattern within the same plane as in the prior art, it is configured such that by arranging the ground pattern 3 below the first wiring layer 14 (namely, disposing the wiring and the ground pattern on a different plane from each other), the distance between the wiring of the first wiring layer 14 and the ground pattern 3 can be brought closer to each other.

In this respect, in order to keep electrical insulation between the first wiring layer 14 and the second wiring layer 15, it is necessary that a lower limit of the thickness D2 of the first insulating layer 11 is larger than the thickness of the second wiring layer 15.

Also, since the outermost surface insulating layer (first insulating layer 11) is reduced in thickness, the present invention is characterized in that a high-frequency filter and a duplexer prepared using such a substrate 1 can be reduced in thickness as compared with the conventional ones.

Example

Example of the filter of the present invention is described with reference to a duplexer configured such that two filter elements are mounted on a low temperature co-fired ceramics (LTCC) substrate. In this respect, this duplexer is a duplexer for Band 1 (transmission band: 1,920 to 1,980 MHz, reception band: 2,110 to 2,170 MHz) of a third-generation mobile phone W-CDMA system.

Figure 2A:
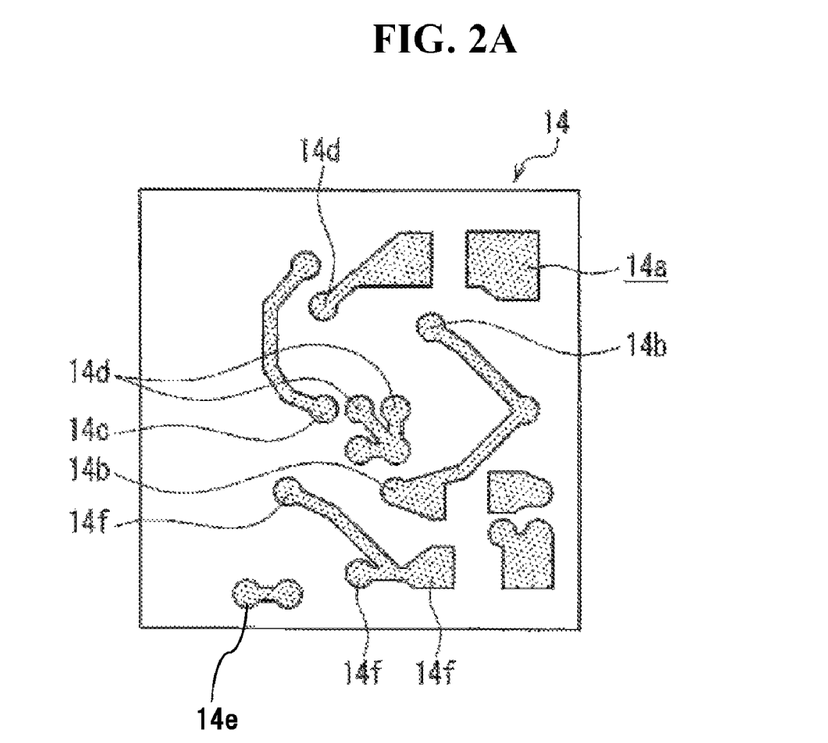
FIG. 2A is a plain view showing a configuration of a first wiring layer in a substrate on which a filter element is mounted.
Figure 2B:
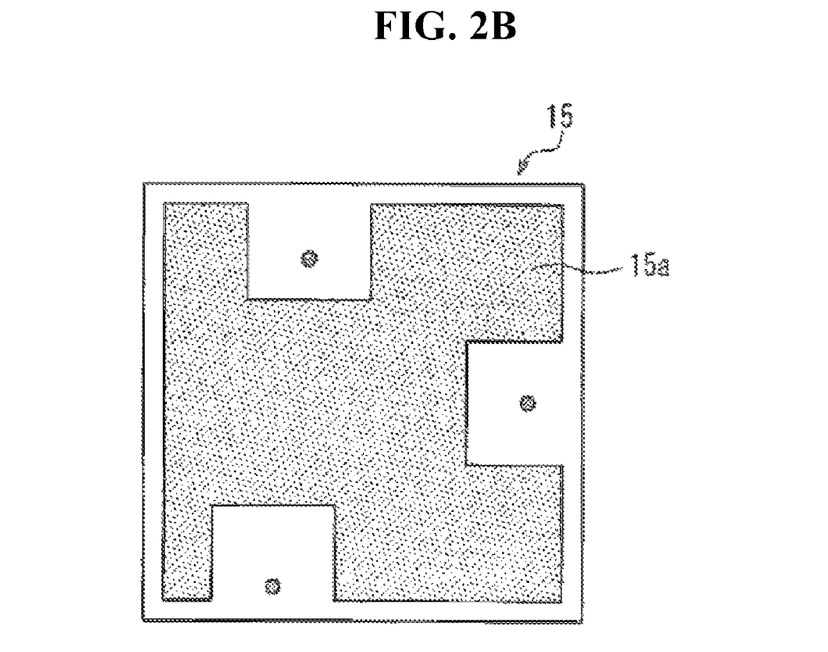
FIG. 2B is a plain view showing a configuration of a second wiring layer in a substrate on which a filter element is mounted.
Figure 2C:
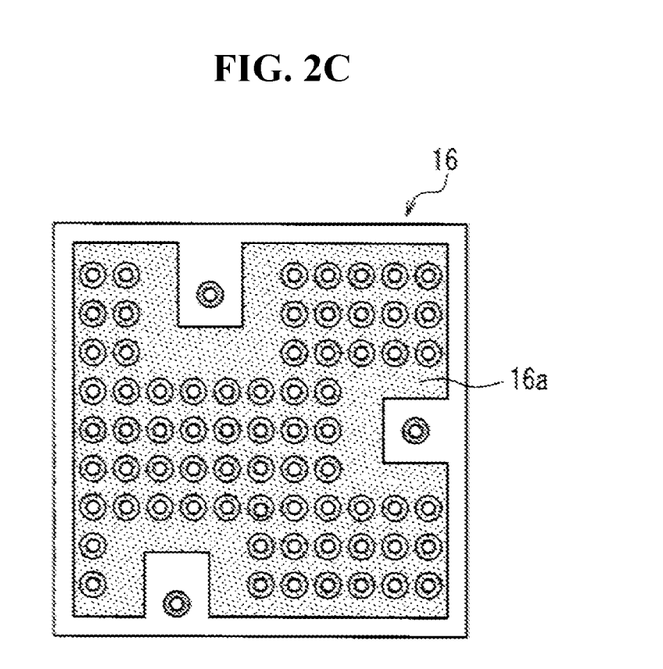
FIG. 2C is a plain view showing a configuration of a third wiring layer in a substrate on which a filter element is mounted.
Figure 2D:
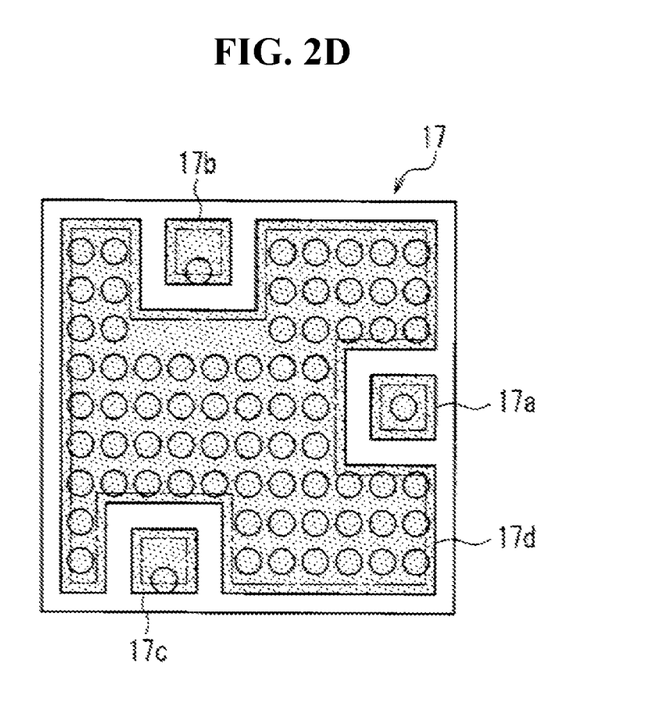
FIG. 2D is a plain view showing a configuration of a fourth wiring layer in a substrate on which a filter element is mounted.
Figure 3:
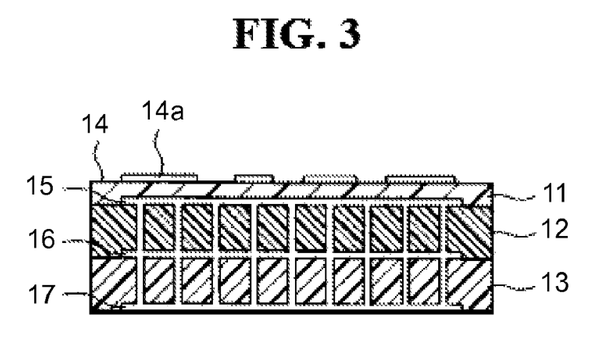
FIG. 3 is a cross-sectional view of a substrate on which a filter element is mounted.

Each of FIGS. 2A to 2D shows a configuration of each of the layers of the substrate of the duplexer that has been made. FIG. 3 shows a cross-sectional view of the substrate of the duplexer. As shown in FIG. 2A, a wiring pattern 14a is formed in the first wiring layer 14 on which the filter element 5 is mounted. The wiring pattern 14a is provided with an antenna terminal 14b, a reception terminal 14c, a ground terminal 14d of a reception filter, a transmission terminal 14e and a ground terminal 14f of a reception filter. As shown in FIG. 2B, a ground pattern 15a for suppressing the unnecessary electromagnetic coupling is disposed in the second wiring layer 15. This ground pattern 15a is corresponding to the ground pattern 3 shown in FIGS. 1A and 1B. The ground pattern 15a is electrically connected to a ground 17d of a foot pattern in the fourth wiring layer 17 shown in FIG. 2D with a plurality of vias between layers through the second wiring layer 15 and the third wiring layer 16 shown in FIG. 2C.

As seen from FIGS. 2A-2D and 3, the ground pattern 15a is also electrically connected to a ground pattern 16a in the third wiring layer 16 through the via holes. Furthermore, the respective ends or node of the antenna terminal 14b, the reception terminal 14c, and the transmission terminal 14e are connected to pads 17a, 17b, and 17c in the fourth wiring layer 17 through corresponding via holes, respectively.

With respect to the thickness of the insulating layer, the outermost surface insulating layer (first insulating layer 11) is 25 μm. Also, for comparison purposes a substrate with 100 μm thick outermost surface insulating layer is made. A thickness of each of the second insulating layer 12, the third insulating layer 13 and the fourth insulating layer 14 was set up at 100 μm. Also, ceramic materials shown in Table 1 can be properly used as the insulating layer.

TABLE 1

| Ceramic material | Dielectric constant |
| --- | --- |
| A | 7 |
| B | 27 |
| C | 81 |
| D | 125 |
| E | 7.8 |
| F | 9 |

Figure 4:
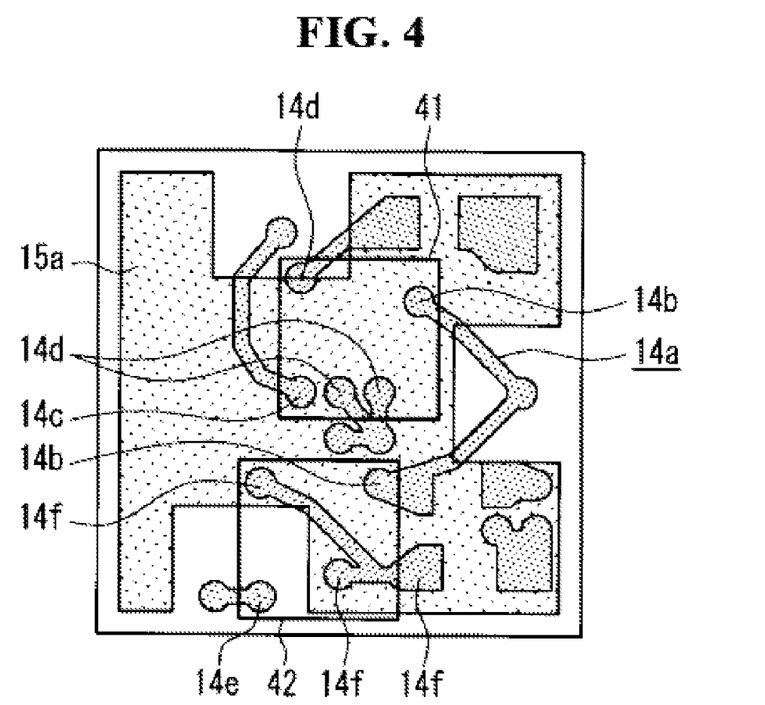
FIG. 4 is a schematic view showing a state where a filter element and respective layers of a substrate are superimposed.

FIG. 4 shows a positional relationship among the filter element 5, the wiring pattern 14a of the first wiring layer 14 and the ground pattern 15a of the second wiring layer 15. Also, FIG. 4 shows a positional relationship of the respective layers when seeing the substrate 1 in a normal line direction of its principal plane. As shown in FIG. 4, in a reception filter 41, the ground pattern 15a is disposed in the second conductor layer 15 over the substantially entire surface directly thereunder. In a transmission filter 42, the ground pattern 15a of the second conductor layer 15 is not disposed directly under a signal line connected to the transmission terminal 14e, and the ground pattern 15a is disposed in a region including one directly under the wiring connected to other ground terminal (ground terminal 14d of the reception filter 41). In this respect, a line width of the wiring pattern is formed to be 100 μm, and the design rule is line/space=100/100 μm.

Figure 5:
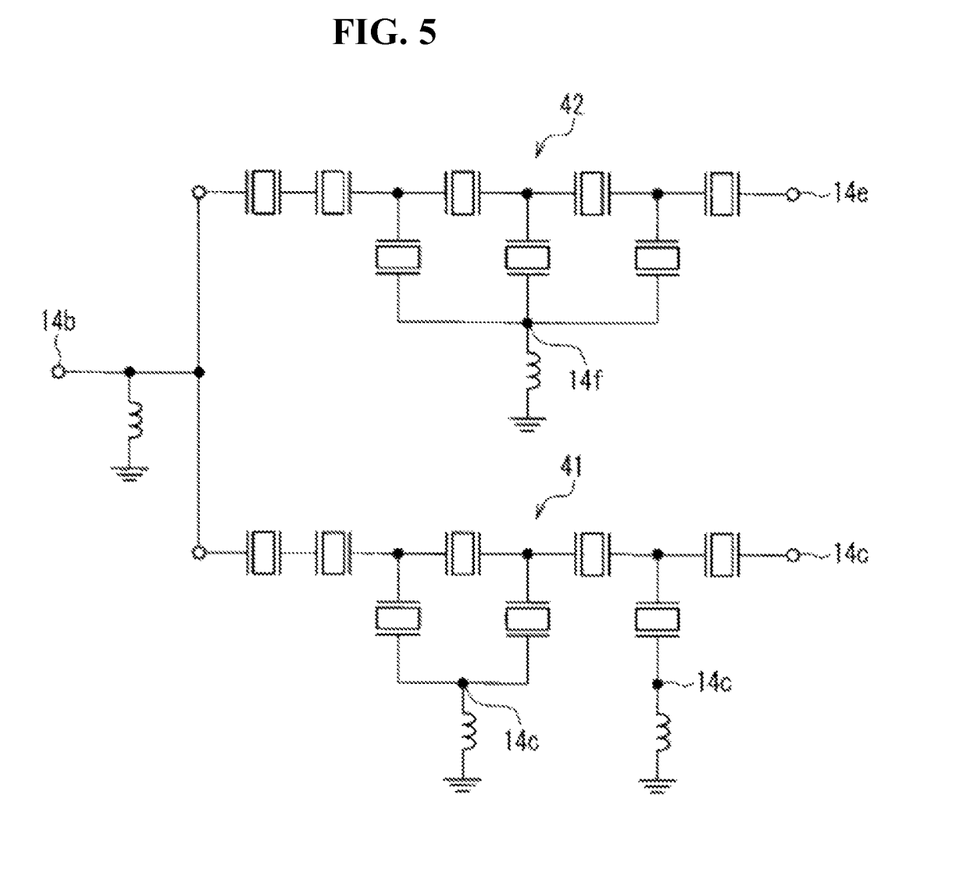
FIG. 5 is a circuit diagram of a duplexer.

FIG. 5 shows a circuit diagram of a duplexer. The reception filter 41 and the transmission filter 42 are configured in a ladder type filter in which FBAR filters are connected to each other in a ladder shape.

Figure 6:
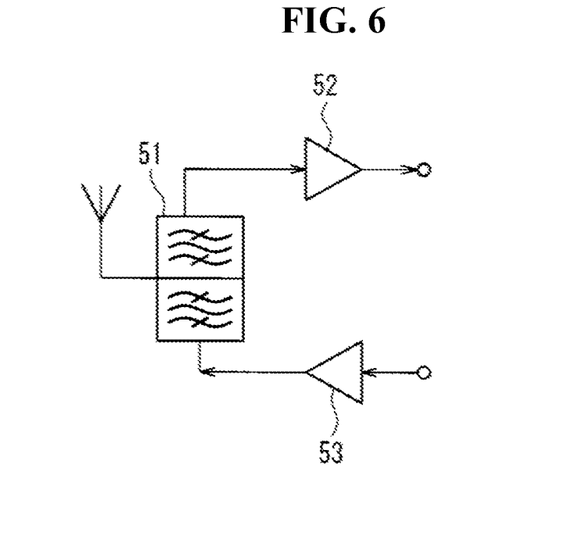
FIG. 6 is a circuit diagram of a communication module using a duplexer of an embodiment.

FIG. 6 shows a configuration of a communication module provided with the duplexer according to the present embodiment. The communication module is provided with a duplexer 51, a low noise amplifier (LNA) 52 and a power amplifier (PA) 53. The duplexer 51 is configured of the duplexer according to the present embodiment.

Figure 7:
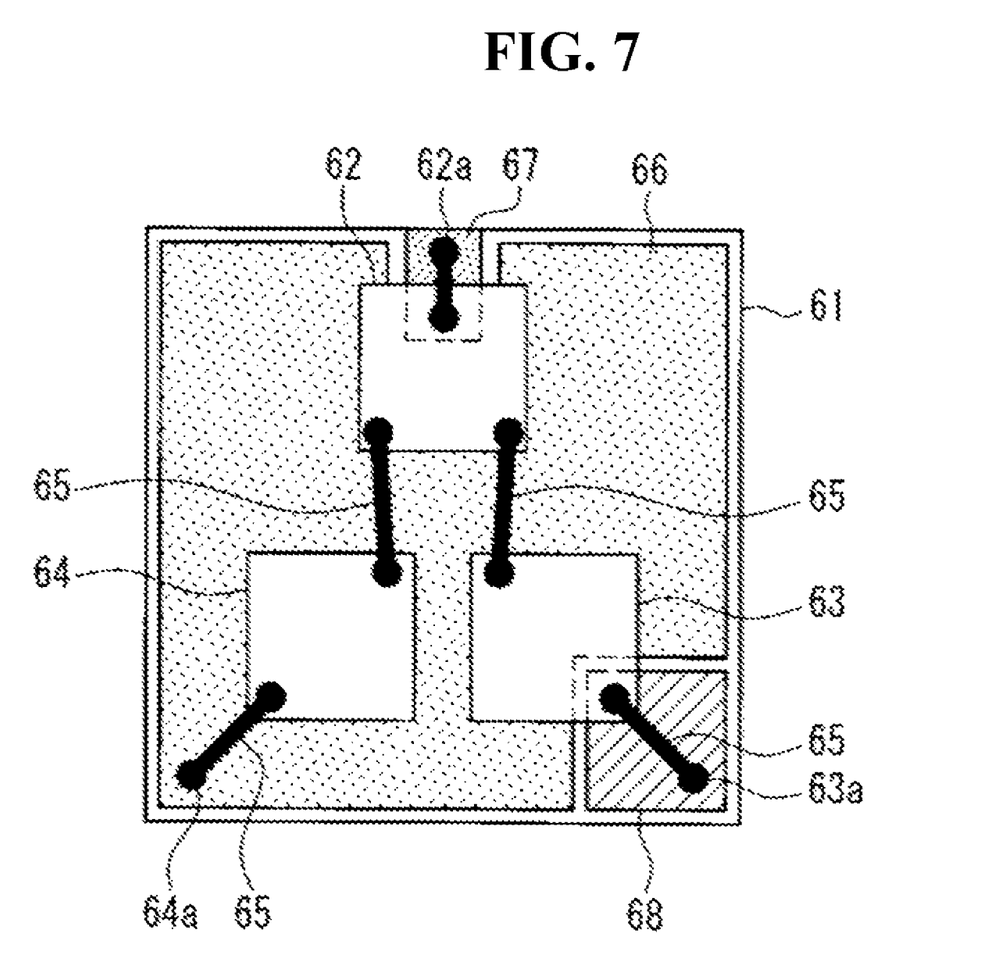
FIG. 7 is a plain view showing a configuration of a duplexer.

FIG. 7 shows a mounting configuration of the duplexer according to the present invention. As shown in FIG. 7, the duplexer is provided with a phase matching circuit 62, a reception SAW filter 63 and a transmission SAW filter 64 on a substrate 61. The phase matching circuit 62 is connected to an antenna port 62a and also connected to each of the reception SWA filter 63 and the transmission SAW filter 64 through a wiring 65 formed in the first wiring layer 14 (see FIG. 1B). The reception SAW filter 63 is connected to a reception port 63a through the wiring 65 formed in the first wiring layer 14. The transmission SAW filter 64 is connected to a transmission port 64a through the wiring 65 formed in the first wiring layer 14. The duplexer shown in FIG. 7 has three kinds of different impedances (impedances of the antenna port 62a, the reception SAW filter 63, and the transmission SAW filter 64), and in the case of taking such a configuration, it is necessary to arrange a ground corresponding to each of the impedances. A first ground pattern 66 is formed in the second wiring layer 15 (see FIG. 1B) and connected with the transmission port 64a. A second ground pattern 67 is formed in the third wiring layer 16 (see FIG. 1B) and connected with the antenna port 62a. A third ground pattern 68 is formed in the fourth wiring layer 17 (see FIG. 1B) and connected with the reception port 63a.

Figure 8:
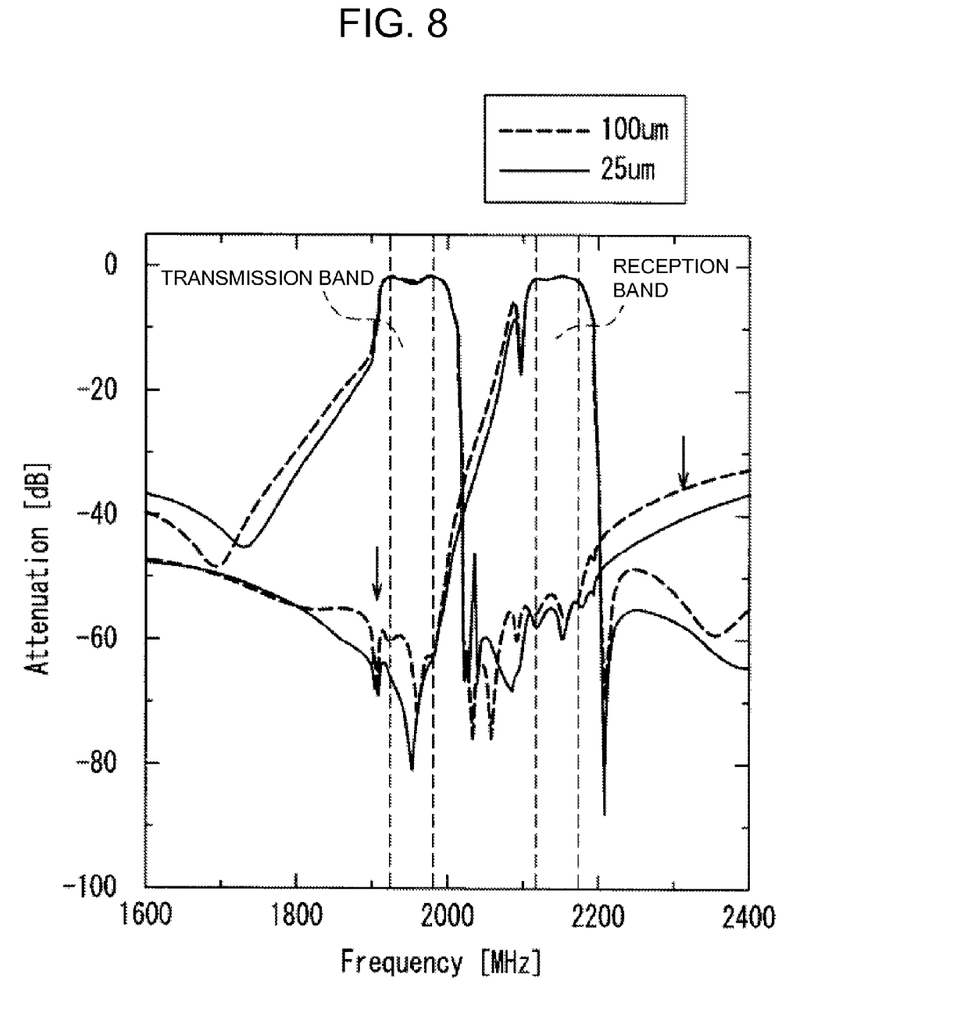
FIG. 8 is a characteristic diagram showing frequency characteristics of a filter according to an embodiment and a conventional filter.
Figure 9:
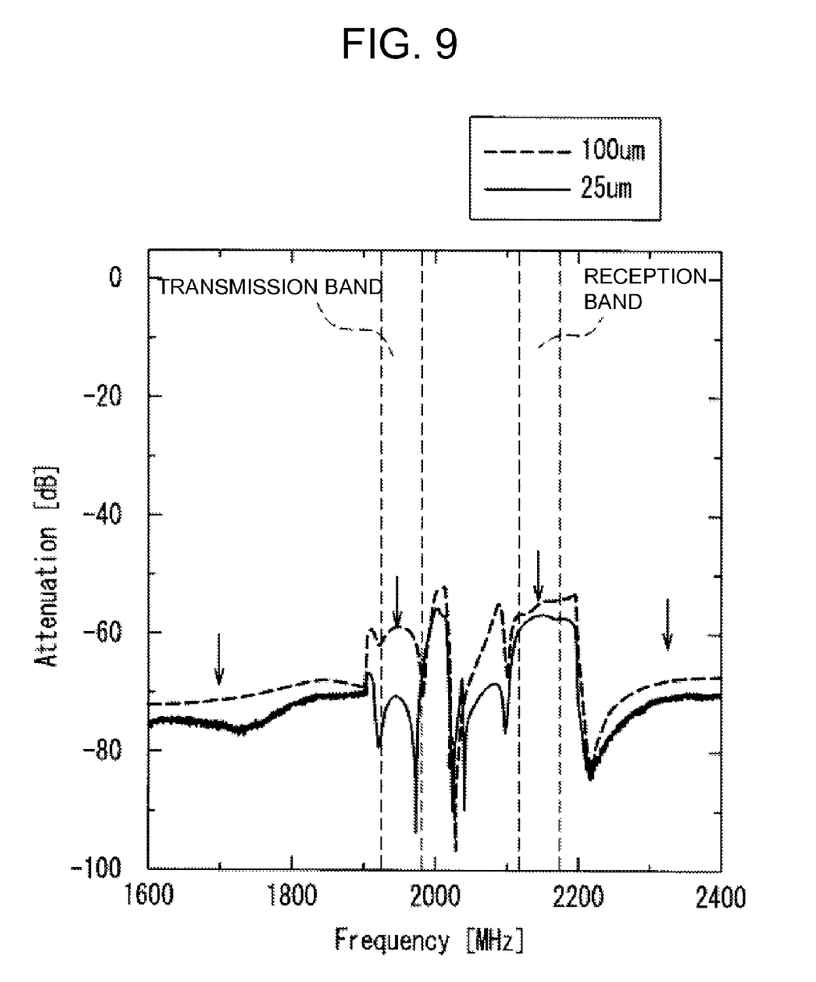
FIG. 9 is a characteristic diagram showing frequency characteristics of a filter according to an embodiment and a conventional filter.

FIG. 8 shows a transmission/reception characteristic in the duplexer shown in FIG. 5. FIG. 9 shows isolation between the reception filter 41 and the reception filter 42 in the duplexer shown in FIG. 5. The characteristics shown in FIGS. 8 and 9 are the results obtained by measuring electrical characteristics using the duplexer shown in FIG. 5. For the measurement, two duplexers were prepared: one in which the thickness of the outermost surface insulating layer (first insulating layer 11) of the filter is 100 μm, a value that is equal to the wiring pattern width; and the other in which the thickness of the outermost surface insulating layer (first insulating layer 11) is 25 μm. As a result of evaluating the respective duplexers, it was discovered that as shown by the solid-line characteristics in FIG. 8, in the case of 25 μm thick outermost surface insulating layer, the suppression level can be improved over a wide frequency band. Also, as shown by the solid-line characteristics in FIG. 9, it was discovered that in particular, the isolation of the transmission band can be reduced by 12 dB and that the isolation can be greatly improved.

In this respect, in the case of disposing the partitioning ground pattern in the same layer as the wiring layer as in the prior art, since the suppression level and isolation are limited to the distance between the wiring pattern and the ground pattern being up to 100 μm, they are equal to the characteristics shown by the broken lines in FIGS. 8 and 9 (characteristics when the thickness of the insulating layer is 100 μm).

Figure 10:
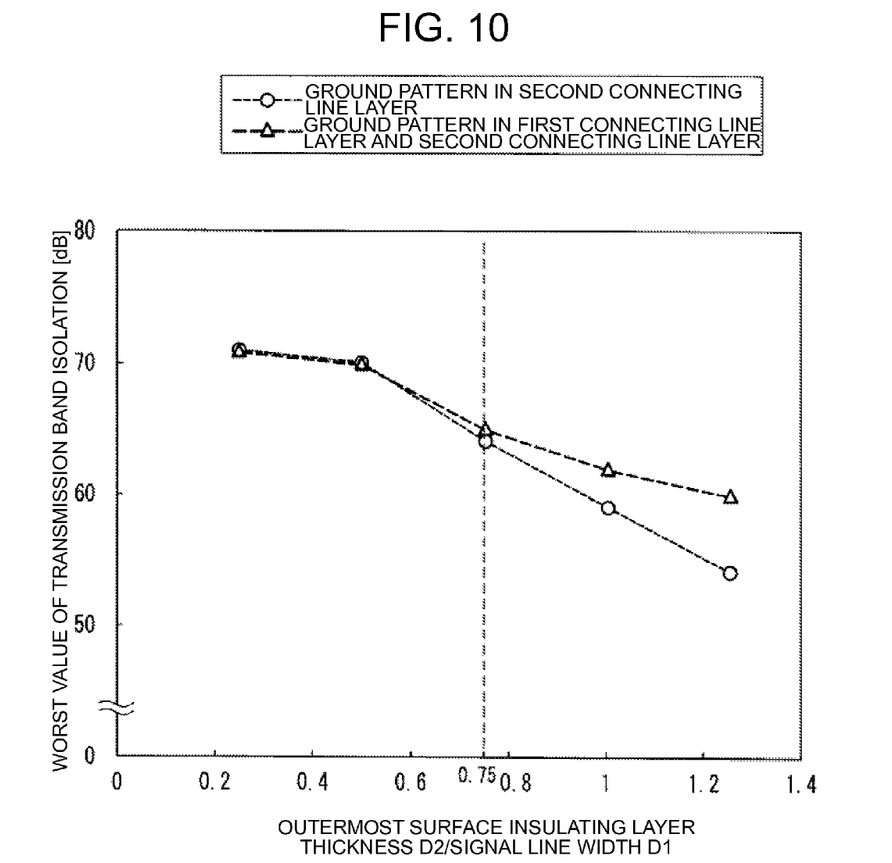
FIG. 10 is a characteristic diagram showing a comparison of isolation by a disposal configuration of a ground pattern.

FIG. 10 shows a change of the transmission band isolation relative to the thickness of the outermost surface insulating layer. Also, FIG. 10 shows the results obtained by calculating characteristics of the duplexer when a partitioning ground pattern was disposed while providing a gap of 100 μm between the wiring patterns of the first wiring layer 14, according to the electromagnetic field simulation. In this respect, the thickness of the outermost surface insulating layer (first insulating layer 11) was also changed. The horizontal axis of FIG. 10 represents the ratio of the thickness of the outermost surface insulating layer to the wiring pattern width. As shown in FIG. 10, the ratio of the thickness of the outermost surface insulating layer to the wiring pattern width being not more than 0.75, the effect by the partitioning ground pattern disappears, and thus, it was discovered that the isolation is determined only by the effect of the ground pattern 3 formed in the second wiring layer 15. Namely, it was discovered that when the ratio of the thickness of the outermost surface insulating layer to the wiring pattern width is not more than 0.75, the partitioning ground is not necessary and that the effect is that design freedom of the wiring pattern increases.

2. Configuration of Communication Device

Figure 11:
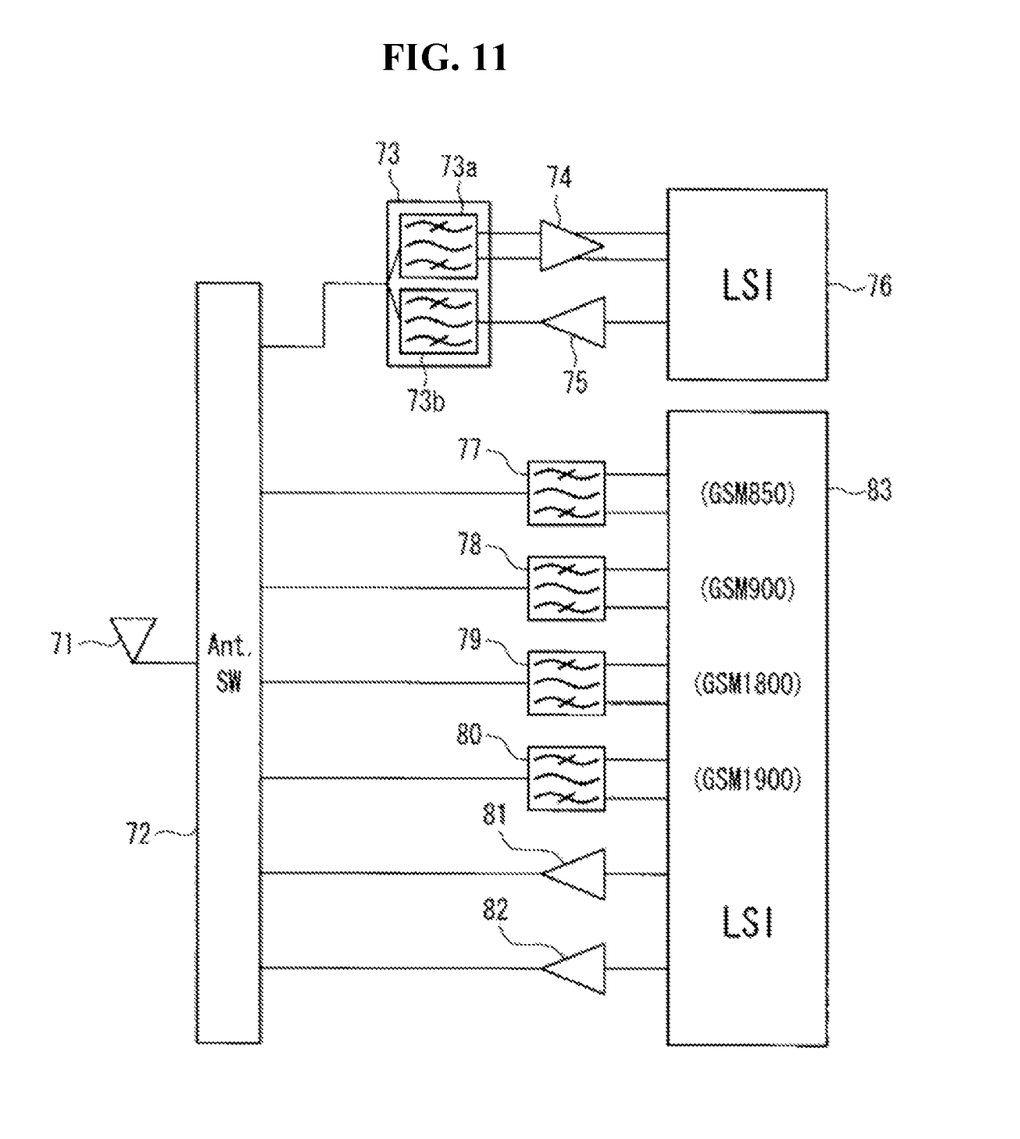
FIG. 11 is a block diagram showing a configuration of a communication device according to an embodiment.

FIG. 11 shows an RF block of a mobile phone terminal as an example of a communication device provided with the filter or duplexer according to the present embodiment. Also, the configuration shown in FIG. 11 shows a configuration of a mobile phone terminal corresponding to a GSM (global system for mobile communications) communication system and a W-CDMA (wideband code division multiple access) communication system. Also, the GSM communication system in the present embodiment is corresponding to an 850 MHz band, a 950 MHz band, a 1.8 GHz band and a 1.9 GHz band, respectively. Also, though the mobile phone terminal is provided with a microphone, a speaker, a liquid crystal display and other components in addition to the configuration shown in FIG. 11, since they are unnecessary in the explanation in the present embodiment, the illustration is omitted. Here, the filter according to the present embodiment is included in each of reception filters 73a, 77, 78, 79 and 80 and a transmission filter 73b. Also, a duplexer 73 can be configured of the duplexer according to the present embodiment.

First of all, with respect to a received signal inputted via an antenna 71, the LSI which is the subject of the action is chosen by an antenna switching circuit 72 depending upon whether the communication system is W-CDMA or GSM. In the case where the inputted received signal is corresponding to the W-CDMA communication system, switching is performed so as to output the received signal into the duplexer 73. The received signal inputted into the duplexer 73 is limited to a prescribed frequency band by the reception filter 73a, and a balance type received signal is outputted to an LNA 74. The LNA 74 amplifies the inputted received signal and outputs it into an LSI 76. The LSI 76 performs demodulation processing into an audio signal based on the inputted received signal or controls each of the components within the mobile phone terminal.

On the other hand, in the case of transmitting a signal, the LSI 76 produces a transmitting signal. The produced transmitting is amplified by a power amplifier 75 and inputted into the transmission filter 73b. The transmission filter 73b allows only a signal of a prescribed frequency band among the inputted transmitting signal to pass through. The transmitting signal output from the transmission 73b is output to the outside from the antenna 71 through the antenna switching circuit 72.

Also, in the case where the inputted received signal is a signal corresponding to the GSM communication system, the antenna switching circuit 72 chooses any one of the reception filters 77 to 80 depending upon the frequency band and outputs a received signal. The received signal whose band has been limited by any one of the reception filters 77 to 80 is inputted into an LSI 83. The LSI 83 performs demodulation processing into an audio signal on the basis of the inputted received signal or controls each of the components within the mobile phone terminal. On the other hand, in the case of transmitting a signal, the LSI 83 produces a transmitting signal. The produced transmitting signal is amplified by a power amplifier 81 or 82 and output outside from the antenna 71 through the antenna switching circuit 72.

In the light of the above, by providing the communication device with the filter or duplexer according to the present embodiment, not only the unnecessary electromagnetic coupling can be suppressed, but the isolation between reception and transmission can be enhanced. Consequently, the communication quality can be enhanced. Also, according to the present embodiment, since the outermost surface insulating layer (first insulating layer 11) is reduced in thickness, contribute to a reduction in thickness of a communication device is possible.

3. Effects, Etc. of Embodiment

By making the thickness D2 of the outermost surface insulating layer (first insulating layer 11) thinner than the wiring pattern width D1 and disposing the ground pattern 3 in the wiring layer one layer below as in the present embodiment, not only the unnecessary electromagnetic coupling can be suppressed, but the isolation between reception and transmission can be greatly improved.

Also, according to the present embodiment, since the outermost surface insulating layer (first insulating layer 11) is reduced in thickness, reduction in size and thickness of a filter and a duplexer is possible. By mounting such a filter or duplexer on a communication module or a communication device, reduction in size and thickness of the communication module or communication device is possible.

Also, based on the results of experiments made by the present inventors, as shown in FIG. 10, by having the thickness D2 of the outermost surface insulating layer (first insulating layer 11) that is not more than 75% of the line width D1 of the wiring 2, a partitioning ground pattern as in the prior art is not necessary, and thus more desirable since the effect is a greater design freedom in designing the wiring pattern.

Also, the effect can also be achieved by making the thickness D2 of the outermost surface insulating layer (first insulating layer 11) thinner than the distance between the adjacent wirings. This is because in the case where the partitioning ground pattern cannot be disposed between the neighboring wirings, the unnecessary electromagnetic coupling between wirings can be suppressed by exposing the electromagnetic field radiations from the respective wirings toward the ground pattern 3, by making the thickness D2 of the outermost surface insulating layer (first insulating layer 11) thinner than the distance between the wirings, and disposing the ground pattern 3 of the second wiring layer 15 adjacently.

Also, it is desirable that the ground pattern 3 disposed in the second wiring layer 15 is disposed directly under the wiring of the first wiring layer 14. By such a configuration, electromagnetic fields radiated from the wiring of the filter element wiring layer 14 can be induced into the ground pattern 3 directly thereunder, and radiation of the electromagnetic fields into surroundings can be suppressed.

Also, it is desirable that the ground pattern 3 disposed in the second wiring layer 15 is disposed directly under the wiring having the most neighboring part in the first wiring layer 14. By such a configuration, in the most neighboring part where the unnecessary electromagnetic coupling is prominent, electromagnetic field radiations from the respective wirings can be induced into the ground pattern 3 directly thereunder, and the electromagnetic coupling between wirings can be suppressed.

Also, it is desirable that the ground pattern 3 disposed in the second wiring layer 15 is disposed directly under the filter element 5. This is because as shown in FIG. 1A, a plurality of the pads 4 for bonding the filter element 5 are present in the first wiring layer 14 directly under the filter element 5; and the bonding pads 4 are disposed adjacent to each other, and they become a factor to cause the unnecessary electromagnetic coupling. In consequence, by disposing the ground pattern 3 directly under the filter element 5, the unnecessary electromagnetic coupling can be suppressed.

Also, it is also desirable that the ground pattern 3 disposed in the second wiring layer 15 is disposed directly under the wiring connected to the ground terminal of the filter element 5 in the first wiring layer 14. This is because when the ground pattern 3 is disposed adjacently directly under the wiring connected to the signal terminal of the filter element 5, the characteristic impedance of the wiring changes and deteriorates a filter passing characteristic, whereas according to the configuration in which the ground pattern 3 is disposed directly under the wiring connected to the ground terminal, the deterioration of a filter characteristic to be caused due to the impedance change is so small that it is negligible, and only the effect for suppressing the unnecessary electromagnetic coupling is obtained.

Also, it is desirable that a material on which the filter is mounted is a ceramic. By such a configuration, it becomes easy to seal the filter element 5 in an airtight manner. Furthermore, in general, the ceramic material is small in dielectric loss tangent, and a loss of each of a high-frequency filter and a duplexer can be kept small. In consequence, it is possible to realize a high-frequency filter and a duplexer with high suppression in a low loss.

Also, in the case of mounting a plurality of the filter elements 5 on the substrate 1, a material of the substrate 1 may be a resin. By such a configuration, in the case of mounting a plurality of the filter elements 5 on the substrate 1, even when the size of the substrate 1 is large, it is possible to reduce the cost of the filter by using a resin-made printed wiring board.

Also, in the substrate 1 on which the filter element 5 is mounted, the outermost surface insulating layer (first insulating layer 11) can be formed of a resin material, and the other insulating layer can be formed of a ceramic. In this way, by forming the outermost surface insulating layer by using a resin which is in general easier to reduce thickness compared with ceramic, a thin outermost surface insulating layer can be easily made. Also, by preparing the insulating layer other than the outermost surface insulating layer by using a ceramic having such a characteristic feature that the dielectric loss tangent is small compared with that of a resin, it is possible to make an insulating layer with small dielectric loss tangent. In consequence, advantages of the both materials can be effectively utilized.

Also, the filter element 5 can be configured of a surface acoustic wave filter (SAW filter) or a thin bulk acoustic resonator filter (FBAR filter). By such a configuration, it is possible to realize a small-sized high-frequency filter and a duplexer with low loss.

Also, it is desirable that the filter element 5 is mounted on the substrate 1 by face down bonding.

Also, it is desirable that the ground pattern 3 disposed in the second wiring layer 15 is connected with a foot pattern for earth by a plurality of vias between layers. This is because the potential of the ground pattern 3 disposed in the second wiring layer 15 gets closer to that of a true ground, and therefore, an electromagnetic field radiated from the wiring of the first wiring layer 14 advances more toward the ground pattern 3, and the unnecessary electromagnetic coupling between wirings can be suppressed.

INDUSTRIAL APPLICABILITY

The filter, the duplexer, the communication module and the communication device of the present invention are useful for equipment capable of receiving or transmitting a signal of a prescribed frequency.

The invention claimed is:

1. A filter comprising a substrate and a filter element mounted on said substrate, said substrate comprising:
a plurality of wiring layers including a filter element wiring layer with a wiring formed thereon, said filter element being connected to said filter element wiring layer;
an insulating layer interposed between said plurality of wiring layers; and
a ground part formed in at least a part of another wiring layer under said filter element wiring layer,
wherein said ground part is absent in said another wiring layer below at least a portion of a wire in the filter element wiring layer that is connected to a signal terminal of said filter element,
wherein the thickness of said insulating layer interposed between said filter element wiring layer and said another wiring layer is smaller than the width of the wiring formed in said filter element wiring layer, and is larger than the thickness of said another wiring layer.

2. The filter according to claim 1, wherein the thickness of said insulating layer interposed between said filter element wiring layer and said another wiring layer is not more than 75% of the width of the wiring formed in said filter element wiring layer and is larger than the thickness of said another wiring layer.

3. A filter comprising a substrate and a filter element mounted on said substrate, said substrate comprising:
a plurality of wiring layers including a filter element wiring layer with a wiring formed thereon, said filter element being connected to said filter element wiring layer;
an insulating layer interposed between said plurality of wiring layers; and
a ground part formed in at least a part of another wiring layer under said filter element wiring layer,
wherein said ground part is absent in said another wiring layer below at least a portion of a wire in the filter element wiring layer that is connected to a signal terminal of said filter element,
wherein the thickness of said insulating layer interposed between said filter element wiring layer and said another wiring layer is smaller than the distance between the most adjacent wirings in said filter element wiring layer, and is larger than the thickness of said another wiring layer.

4. The filter according to any one of claims 1, 2, and 3, wherein said ground part is disposed in at least a part of a region directly under two wirings including the most adjacent parts among wirings formed in said filter element wiring layer.

5. The filter according to any one of claims 1, 2, and 3, wherein said ground part is disposed in at least a part of a region directly under the filter element in said another wiring layer.

6. The filter according to any one of claims 1, 2, and 3, wherein said ground part in said another wiring layer is disposed in at least a part of a region directly under a wiring connected to a ground terminal of said filter element among wirings formed in said filter element wiring layer.

7. The filter according to any one of claims 1, 2, and 3, wherein said substrate is formed of a ceramic material.

8. The filter according to any one of claims 1, 2, and 3, wherein said substrate is formed of a resin material.

9. The filter according to any one of claims 1, 2, and 3, wherein at least an outermost surface insulating layer in said substrate is formed of a resin material; and at least a part of other insulating layers in said substrate is formed of a ceramic material.

10. The filter according to any one of claims 1, 2, and 3, wherein said filter element is configured of an acoustic wave filter.

11. The filter according to claim 10, wherein said filter element is mounted on said substrate by face down bonding.

12. The filter according to any one of claims 1, 2, and 3, wherein said ground part is connected with a foot pattern for earth of said substrate by a plurality of vias between layers.

13. A duplexer comprising the filter according to any one of claims 1, 2, and 3.

14. A communication module comprising the filter according to any one of claims 1, 2, and 3.

15. A communication device comprising the communication module according to claim 14.

* * * * *